United States Patent
Beiley et al.

[11] Patent Number: 5,939,936
[45] Date of Patent: Aug. 17, 1999

[54] SWITCHABLE N-WELL BIASING TECHNIQUE FOR IMPROVED DYNAMIC RANGE AND SPEED PERFORMANCE OF ANALOG DATA BUS

[75] Inventors: Mark A. Beiley, Chandler; Lawrence T. Clark, Phoenix; Eric J. Hoffman, Chandler, all of Ariz.

[73] Assignee: Intel Corporation, Santa Clara, Calif.

[21] Appl. No.: 09/003,264

[22] Filed: Jan. 6, 1998

[51] Int. Cl.[6] .................................................. H03K 3/01
[52] U.S. Cl. ............................ 327/537; 327/534; 327/434
[58] Field of Search ...................................... 327/534, 535, 327/537, 94, 427, 434, 77; 326/36, 31, 33

[56] References Cited

U.S. PATENT DOCUMENTS

| | | | |
|---|---|---|---|
| 4,271,488 | 6/1981 | Saxe et al. | 365/230 |
| 4,922,452 | 5/1990 | Larsen et al. | 365/45 |
| 5,144,525 | 9/1992 | Saxe et al. | 365/45 |
| 5,157,279 | 10/1992 | Lee | 307/296.2 |
| 5,430,404 | 7/1995 | Campbell et al. | 327/566 |
| 5,461,338 | 10/1995 | Hirayama et al. | 327/534 |
| 5,477,173 | 12/1995 | Schlesselmann et al. | 327/111 |
| 5,541,538 | 7/1996 | Bacrania et al. | 327/77 |
| 5,838,047 | 11/1998 | Yamauchi et al. | 327/537 |

FOREIGN PATENT DOCUMENTS 7-70345  7/1995  Japan.

*Primary Examiner*—Tim Callahan
*Assistant Examiner*—Jung Ho Kim
*Attorney, Agent, or Firm*—Blakely, Sokoloff, Taylor & Zafman

[57] ABSTRACT

A circuit that includes at least two driver circuits. Each driver circuit receives analog information and drives a value related to the analog information to an analog bus. Each driver circuit also includes a select transistor to pass the value related to the analog information to the analog bus when the driver circuit is selected. The select transistor includes a source and a bulk. Each driver circuit further includes a bulk potential control circuit (BPCC) to couple the bulk to the source when the driver circuit is selected and to couple the bulk to a voltage supply when the driver circuit is not selected.

24 Claims, 4 Drawing Sheets

SWITCHABLE N-WELL BIASING TECHNIQUE FOR IMPROVED DYNAMIC RANGE AND SPEED PERFORMANCE OF ANALOG DATA BUS

BACKGROUND OF THE INVENTION (1) Field of the Invention

The present invention relates to electronic circuits. In particular, the present invention relates to reducing body effect in electronic circuits.

(2) Background Information

The body effect is a well-known principle in MOS transistors—the threshold voltage of a Metal Oxide Semiconductor (MOS) transistor varies in accordance with variations in the source-to-bulk voltage of such transistor. In a source follower circuit this effect may cause non-linearity in the output voltage $V_{out}$, as $V_{out}=V_{in}-V_{TN}$, and the threshold voltage $V_T$ increases as the output voltage $V_{out}$ increases.

The body effect and its influence upon electronic circuits is hereinafter generally explained in connection with a basic source follower circuit 100 illustrated in FIG. 1a and the voltage characteristics of this circuit illustrated in FIG. 1b. FIG. 1b illustrates ideal and real output/input voltage characteristics 106 and 108 respectively of the source follower circuit illustrated in FIG. 1a. Ideally, without the body effect, the output voltage is $V_{out}=V_{in}-V_{TN}-V_{overdrive}$. $V_{overdrive}$ is the voltage over the threshold voltage $V_{TN}$ that needs to be applied to a gate of a transistor to provide a bias current. However, when the body effect is accounted for $V_{out}$ is lower. Source follower circuit 100 includes an active device such as NMOS transistors 101 and a load device which may be a device with a fixed impedance such as transistor 102 biased at a predetermined voltage $V_{BIAS}$. Transistor 101, (pull-up transistor) has a gate that receives signal ($V_{in}$) and a drain coupled to a voltage power supply (VCC). Second NMOS transistor 102, (pull-down transistor) has a gate that receives a $V_{BIAS}$ signal that turns ON transistor 102. The second NMOS transistor 102 has a source connected to ground. A source of first NMOS transistor 101 and a drain of second NMOS transistor 102 are commonly coupled to output node 103. Bulks of first and second NMOS transistors are coupled to ground.

In theory, the voltage at output node 103 should be $V_{out}=V_{in}-V_{TN}$ as illustrated by ideal characteristic 106 of FIG. 1b, where $V_{TN}$ is the threshold voltage of NMOS transistor 101. However, a voltage difference between the voltage applied at the source of the first NMOS transistor 101 and the ground voltage, applied to a bulk of this transistor, causes the voltage at output node 103 to be lower than $V_{in}-V_{TN}$ as illustrated by curve 108 of FIG. 1b that takes into account the body effect. The reason is that the body effect causes $V_{TN}$ to raise with the difference $V_{SB}$ between the voltages at the source and bulk of NMOS transistor 101. This is reflected in the formula $V_{TN}=V_{TO}+\Gamma(\sqrt{|-2\Phi_F+V_{SB}|}-\sqrt{2|\Phi_F|})$ according to which, when $V_{SB}\neq 0$, $V_{TN}$ increases with $V_{SB}$. In this formula, $V_{TO}$ is the threshold voltage when $V_{SB}=0$, parameter $\Gamma$(gamma) is termed the body effect coefficient or body factor, and the function $\Phi_F$ is termed equilibrium electrostatic potential in the semiconductor of the transistor. Accordingly, when $V_{TN}$ raises due to body effect, the voltage $V_{in-VTN}$ at the output node is decreased. This causes a decline in output gain.

One application where the body effect is problematic is a multiplexed analog bus with a large number of imputs ports, where each input port is driven by a source-follower. Each input ports may include at least one MOS transistor coupled to the analog bus. The body effect may affect the voltage driven to the analog bus due to variation of $V_{TN}$ with $V_{SB}$. Such variation causes the voltage driven to the analog bus to be smaller than the actual voltage that could be driven to the analog bus in the absence of the body effect. Therefore, the body effect may cause a decrease in the output range of the analog data bus with multiplexed inputs port. It is desirable to reduce the body effect at the inputs port of a multiplexed analog bus, thereby increasing the output range of an analog bus. Moreover, parameters may vary from transistor to transistor, requiring an extra matching parameter. Reducing the body-effect from the transistor may reduce the desirability of providing the extra matching parameter.

SUMMARY OF THE INVENTION

Briefly, one embodiment of the present invention provides a circuit that includes at least two driver circuits. Each driver circuit receives analog information and drives a value related to the analog information to an analog bus. Each driver circuit also includes a select transistor to pass the value related to the analog information to the analog bus when the driver circuit is selected. The select transistor has a source and a bulk. Each driver circuit further includes a bulk potential control circuit (BPCC) to couple the bulk to the source when the driver circuit is selected and to couple the bulk to a voltage supply when the driver circuit is not selected.

BRIEF DESCRIPTION OF THE DRAWINGS

The features, aspects, and advantages of the present invention will become more fully apparent from the following Detailed Description, appended claims, and accompanying drawings in which:

FIG. 1b illustrates a voltage characteristic in connection with the prior art source follower of FIG. 1a;

DETAILED DESCRIPTION OF THE INVENTION

In the following description, numerous specific details are set forth to provide a thorough understanding of the present invention. However, one having ordinary skill in the art should recognize that the invention may be practiced without these specific details. In some instances, well-known circuits, structures, and techniques have not been shown in detail to avoid obscuring the present invention.

Briefly, one embodiment of the present invention provides a multiplexed input circuit that is coupled to an analog bus. The circuit includes at least two driver circuits. Each driver circuit receives analog information and drives a value related to the analog information to an analog bus. The analog information may be a voltage related to an intensity of a light detected by a pixel cell of an array of pixel cells. Each driver circuit includes a select transistor that passes the value related to the analog information to the analog bus when the driver circuit is selected. The select transistor has a source and a bulk. The present invention also provides a bulk potential control circuit (BPCC) that couples the bulk of the select transistor to the source of this transistor when the driver circuit is selected. The BPCC couples the bulk to the voltage supply when the driver circuit is not selected.

The embodiment of the circuit of the present invention provides improved output signal range and speed performance of an analog data bus with a number of multiplexed inputs signals. The output signal range is increased as the BPCC provides a way to reduce the body effect of the select transistor. The body effect otherwise may cause a decrease in the output signal range of the analog bus. The circuit according to the present invention also reduces the loading on the analog bus by connecting the bulk to the source of the select transistor of the selected driver circuit. The select transistors of driver circuits that are not selected do not have their bulks coupled to their sources thereby reducing the loading on the bus. Rather, the select transistors of the driver circuits that are not selected have their bulks coupled to a voltage supply to turn off these select transistors and, therefore, reduce the loading on the bus. Reduced loading allows greater speed performance of the analog bus.

Figure 1A:
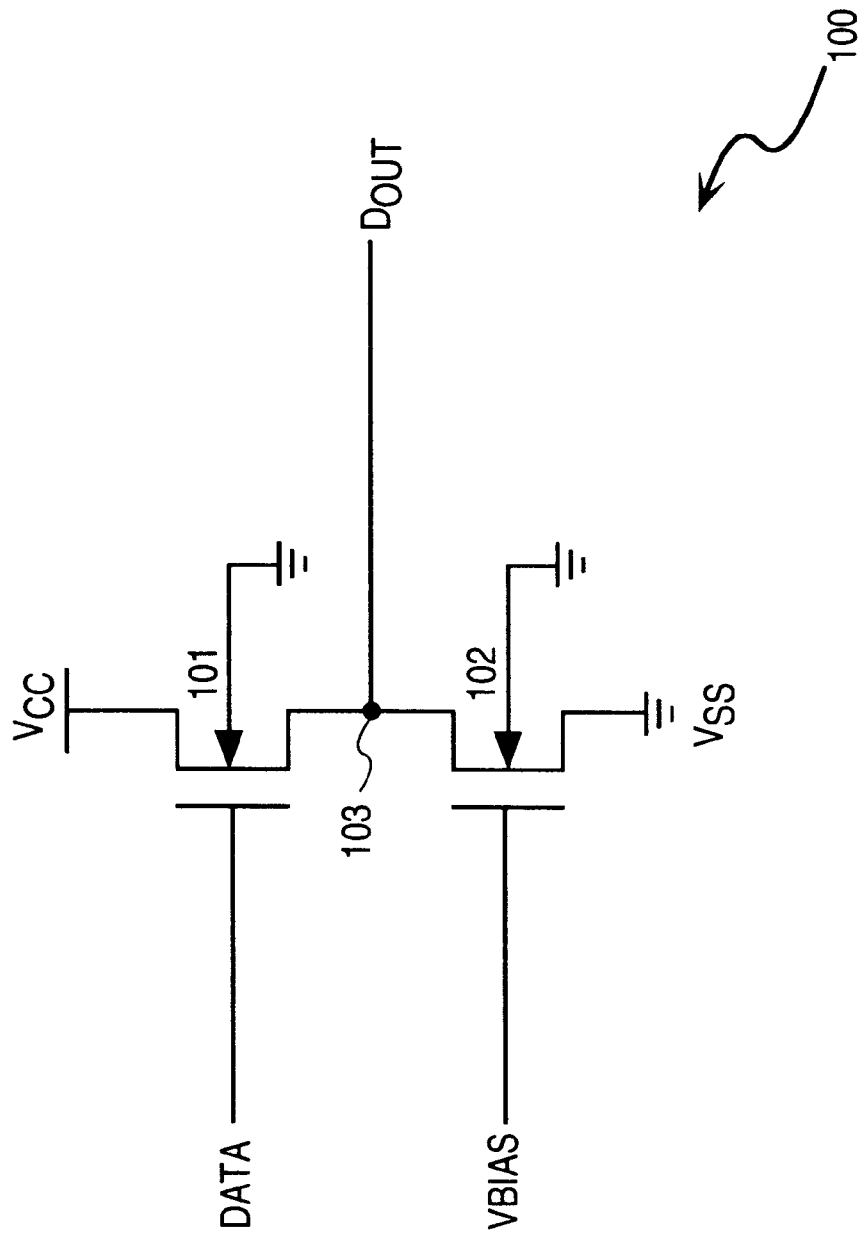
FIG. 1a illustrates a prior art source follower circuit.
Figure 1B:
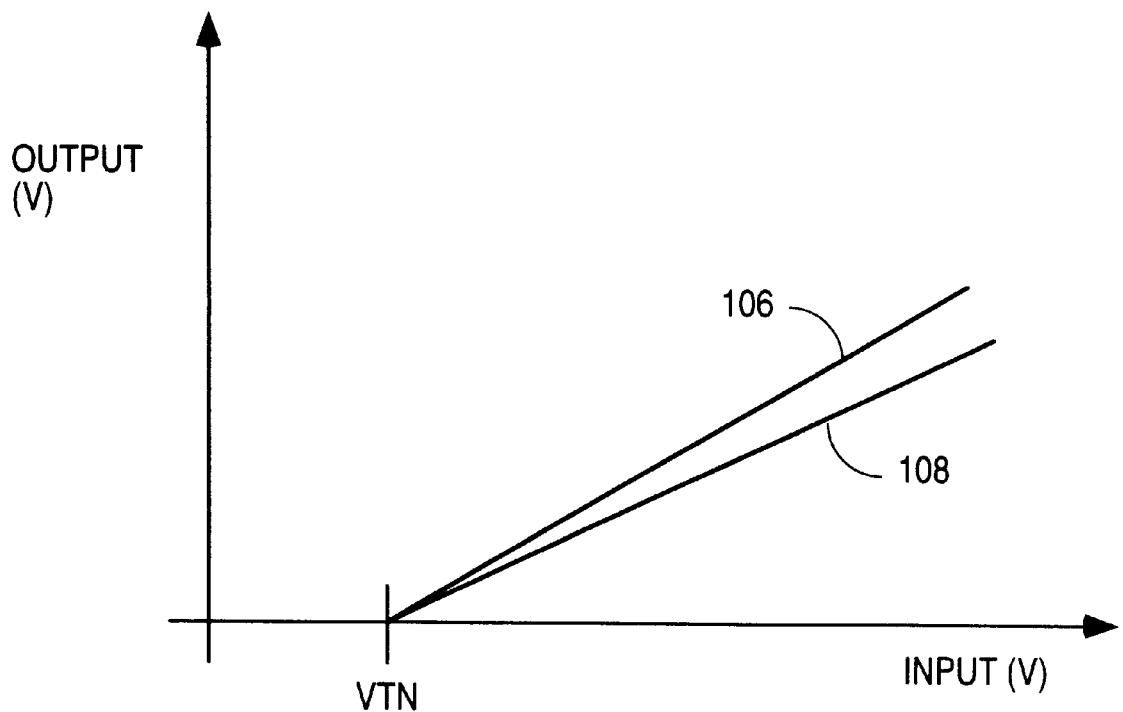
Figure 2:
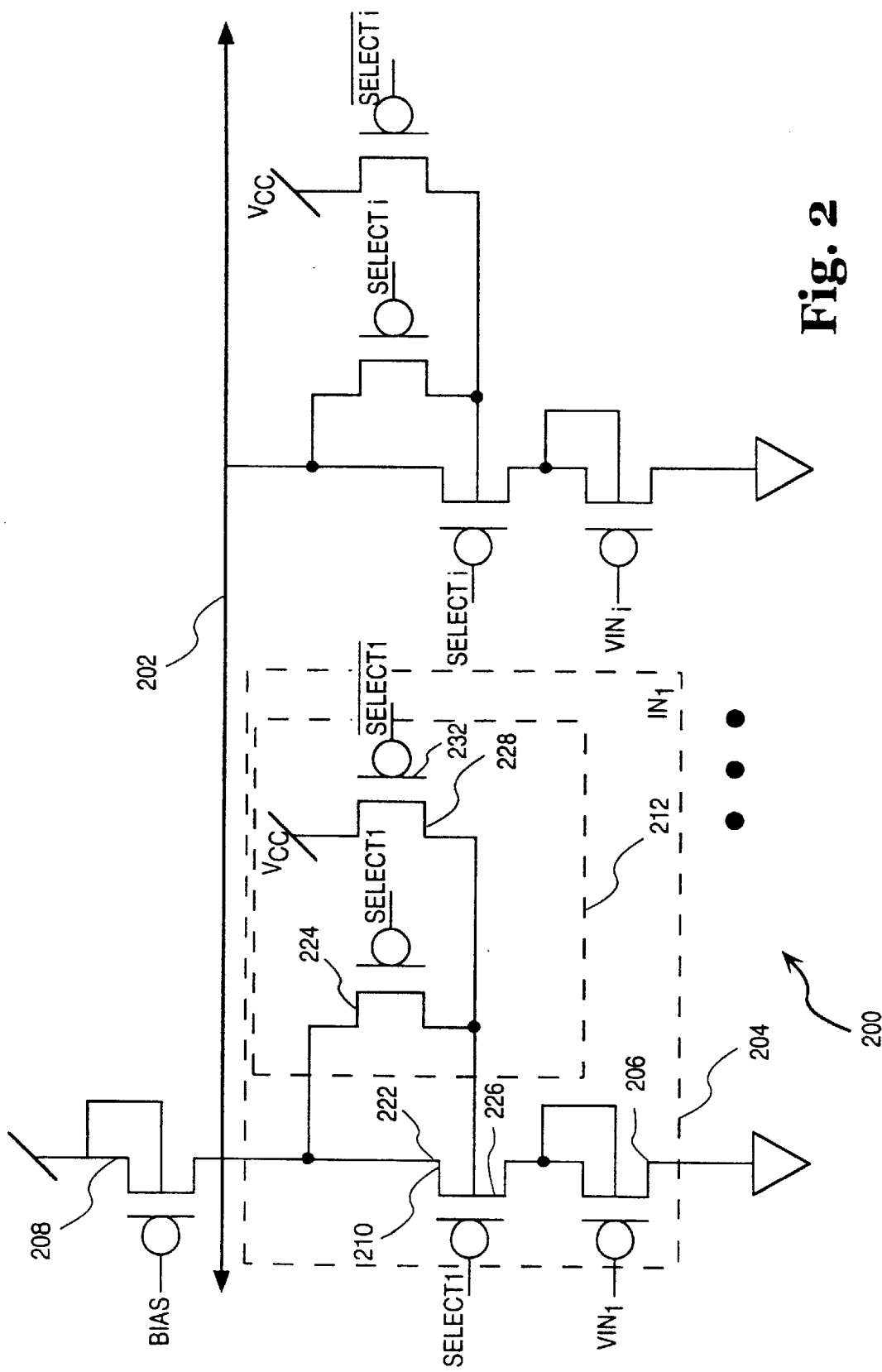
FIG. 2 illustrates one embodiment of a circuit according to the present invention.

FIG. 2 illustrates one embodiment of a input circuit 200 according to the present invention. Input circuit 200 is used in connection with an analog bus 202. The analog bus 202 may be coupled to an analog memory in which sample-and-hold elements are arranged in rows and columns. Input circuit 200 includes at least two driver circuits 204 coupled thereto. The figure illustrates a plurality of driver circuits 204 to which analog information (analog voltages) $VIN_i$ may be driven. In one embodiment of the present invention described herein, input signal $VIN_i$ may be a signal detected by a photo detector of a CMOS active pixel sensor array (not shown) which is known in the art. For example, input signal $VIN_i$ may be a signal that represents the intensity of the light detected by a photo sensor of the CMOS active pixel sensor array.

The driver circuit 204 includes a source follower circuit that is made up of source following transistor 206 and a load transistor 208. The load transistor 208 is common to all source follower circuits of circuit 200. In one embodiment of the circuit 200 according to the present invention, the source following devices and the load device are PMOS transistors, but the present invention is not limited in any respect to this implementation. The present invention may be equally implemented in connection with NMOS technology. The following discussion is presented in connection with the first input circuit $IN_1$ (from the left of the page) being understood that the present invention applies to all input circuits $IN_1$.

The source following transistor 206 receives at a gate thereof the input signal $VIN_1$ and drives a signal related to $VIN_1$ ($VIN_1+V_{TH}$) to the output (source) of the source following transistor 206. A select transistor 210 is coupled between the analog bus and the source of source following transistor 206. Depending on whether the circuit $IN_1$ is selected by assertion of a $SELECT_1$ signal to a gate of transistor 210, signal $VIN_1+V_{TH}$ is driven to analog bus 202.

To increase the output signal range and speed performance of the analog bus, the input circuit 204 includes a bulk potential control circuit (BPCC) 212 (shown in dotted lines). BPCC 212 controls the voltage at bulk 226 of transistor 210. One of the functions of the BPCC is to make the voltage at the bulk 226 be substantially equal with a voltage at the source 222 of transistor 210 when the $SELECT_1$ signal to the gate of select transistor 210 is asserted. In one embodiment of the present invention, BPCC 212 includes a first transistor 224 with a drain thereof coupled to the bulk 226 of transistor 210 and the source thereof coupled to a source 222 of transistor 210. The $SELECT_1$ signal is routed to a gate of first transistor 224.

When driver circuit 204 is selected, by asserting the $SELECT_1$ signal to the gate of select transistor 210, the $SELECT_1$ signal routed to the gate of first transistor 224 causes first transistor 224 to turn on thereby coupling the bulk 226 to the source 222 of transistor 210. Coupling the bulk to the source of select transistor 210 causes reduction of the body effect of transistor 210 and therefore an increase in the output signal range of the analog bus.

When the $SELECT_1$ signal to the gate of first transistor 224 is asserted, the $SELECT_i$ signals, with $I \neq 1$, for the non-selected driver circuits are deasserted as one select transistor is selected at one time. The first transistors 224 of the BPCCs of the non-selected driver circuits are turned OFF by $SELECT_i$ signals. The non-selected drivers do not considerably add capacitive loading to the analog bus as in the case the bulks of all select transistors were directly coupled to the analog bus. The source diffusion of first transistor 224 is much lower than the N-well capacitance of transistor 226.

If the input circuit 204 is not selected, the $SELECT_1$ signal is biased at logic 1 and transistors 210 and 224 are off. To ensure that the non-selected select transistors 210 are off and not floating when the select signal applied thereto is not asserted. The BPCC of this embodiment further includes a second transistor 228 that couples the bulk 226 of transistor 210 to a voltage supply VCC when the respective driver circuit is not selected. By turning off transistors 210 of non-selected driver, the bus loading is reduced. To achieve this, second transistors 228 have their gate coupled to a signal $\overline{SELECTi}$ which is the logic complement of the $SELECT_i$ signal.

Figure 3:
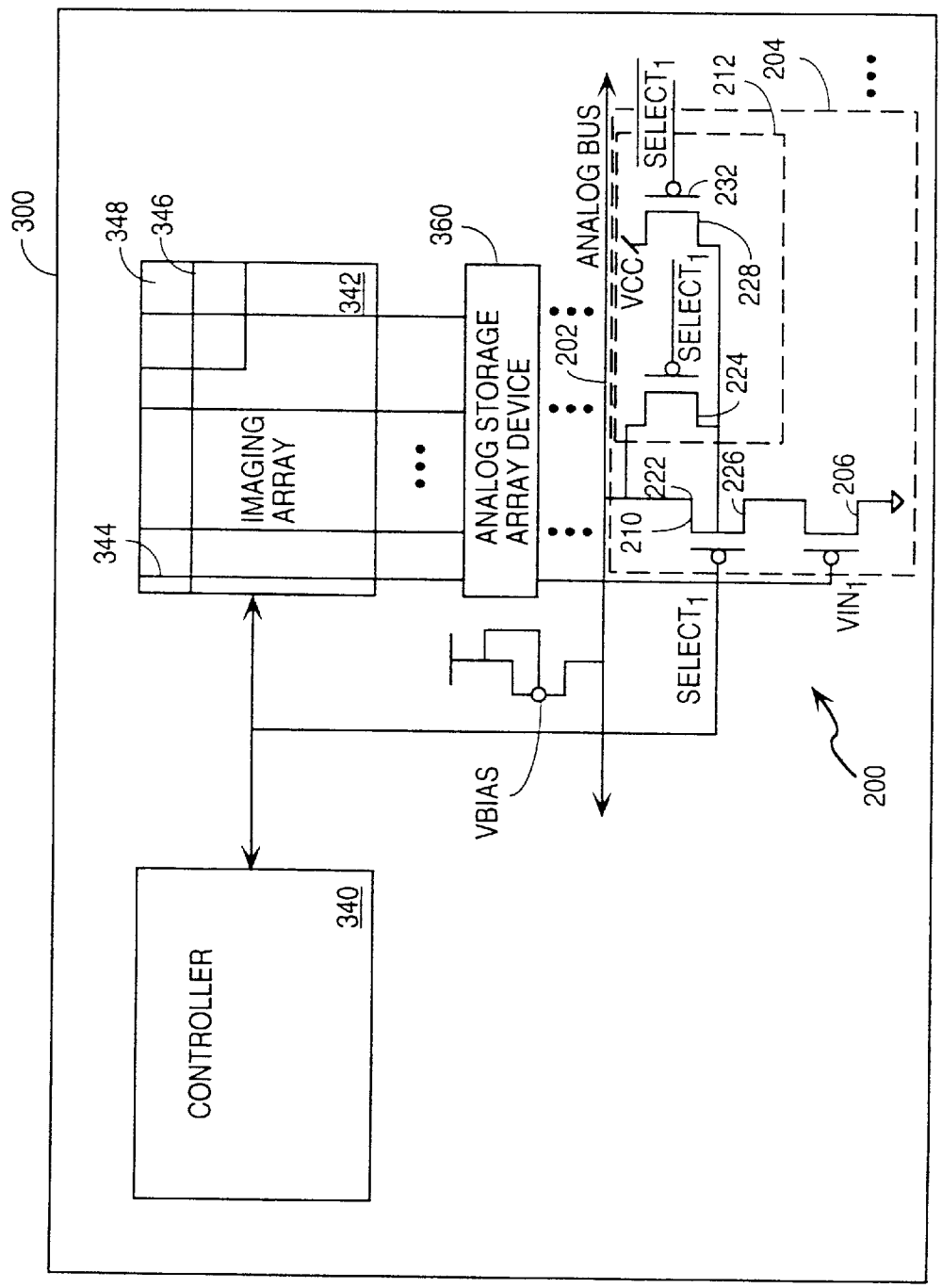
FIG. 3 illustrates a block diagram of an imaging system that utilizes one embodiment of the circuit according to the present invention.

FIG. 3 illustrates an application of an embodiment of the present invention utilized in an imaging system 300. The imaging system 300 includes a controller 340 coupled to an imaging array 342. Both the controller 340 and the imaging array 342 are coupled to a plurality of multiplexed input circuits 200 according to the present invention. Columns 344 of imaging array 342 drive analog signals to gates of the source following transistors 206. The SELECT signals are driven by a column decoder (not shown) of controller 340.

Imaging array 342 includes a plurality of pixel cells 348 that may be used to detect light reflected by an object. Each pixel cell is coupled to a dedicated row 346 and to a dedicated column (bitline) 344. Pixel cells 348 include image sensors such as photodiodes or photogates that generate photo charges proportional to light reflected from the object to be imaged. Photo charges from each pixel 348 are converted into a signal (charge signal) or potential representative of a level of energy reflected from a respective portion of the object to be imaged. The signal or potential is read out and processed by video processing circuitry to create an image representing an object.

Pixels belonging to a same bitline are usually coupled at a common bitline output node (not shown) from where a signal or potential, representative of the level of energy, is read out. Pixels belonging to the same bitline "see" an overall capacitance (hereinafter referred to as "bitline capacitance"), at the common output node. Each pixel in a same bitline is individually controlled to read out at the common output node. Typically, pixels belonging to a same row are commonly controlled by a same signal (WORDLINE) such that an entire row of the array may be read out at a substantially same time.

Typically, a pixel cell 348 includes a driving device (not shown) that receives an electronic signal indicative of an intensity of light detected by an image sensor included in the pixel cell. The driving device drives a current proportional to the measure of intensity, to a bitline 344 to which the pixel cell is coupled. Following signal integration, the pixels in a selected row are accessed by asserting a WORDLINE signal to a pixel access device (not shown) of each pixel cell of the selected row. Then the bitlines to which the pixel cells of a same selected row are coupled may be charged by a current driven by the driving device of the pixel cells of the selected row, to a voltage level representative of an intensity of light detected by the pixel cells of the selected row. The pixels of an entire row may thus be read out at a substantially same time. The pixel cells of other rows, not currently accessed, have their pixel access devices switched off by deasserted WORDLINE signals corresponding to these rows.

The bitlines may further be coupled (outside the array 342) to a an analog storage array 360. The analog storage array includes, for each column of imaging array 342, an analog storage element such as a capacitor for example. Typically, one row of the imaging array is read out at one time and analog signals from each cell of that row are stored into a corresponding analog storage element. The analog signals are multiplexed to the analog bus. The analog signals are driven to the gates of the source following transistors 206. Only one source follower is activated at one time by asserting the SELECT$_i$ signal to the gate of a selected select transistor driving source. The analog voltages read out from the pixel cells of a row of the array are driven to the analog bus one by one by asserting the corresponding SELECT$_i$ signal to one of transistors 210.

The BPCC with the first transistor 224 causes reduction in the body effect of select transistor 210 thereby causing an increase in the signal range of the analog bus, which directly translates to improvement in the dynamic range of the image sensor coupled to the input circuit 204. Also, the presence of the second transistor 228 reduces the loading on the analog bus and provides improved speed performance of the analog bus, which allows image sensors utilizing input circuits according to this embodiment of the present invention to offer greater frame rates.

Note that the embodiment described herein uses all PMOS devices due to the ability to electrically isolate the N-type doped well on a P-substrate type of process. In an alternative embodiment of the present invention all devices may be NMOS devices on a process having an N-type substrate or may be on a "twin-tub" CMOS process.

In the foregoing specification, the invention has been described with reference to specific embodiments thereof. It will however be evident that various modifications and changes can be made thereto without departing from the broader spirit and scope of the invention as set forth in the appended claims. The specification and drawings are, accordingly, to be regarded in an illustrative rather than a restrictive sense. Therefore, the scope of the invention should be limited only by the appended claims.

We claim:

1. A circuit comprising:
   at least two driver circuits to receive analog information and to drive a value related to said analog information to an analog bus, each driver circuit including:
   a select transist or to pass said value related to said analog information to said analog bus when said driver circuit is selected, said select transistor having a source and a bulk, and
   a bulk potential control circuit (BPCC) to couple said bulk to said source when said driver circuit is selected and to couple said bulk to a voltage supply when said driver circuit is not selected.

2. The circuit of claim 1, said driver circuit includes a source follower circuit (SFC) to receive said analog information and drive said analog information to said select transistor.

3. The circuit of claim 1, said BPCC includes first MOS transistor device having a drain coupled to said bulk, a source coupled to said source of said select transistor and a gate coupled to a gate of said select transistor.

4. The circuit of claim 3, said first Metal Oxide Semiconductor (MOS) transistor having a gate coupled to a first signal, said BPCC includes a second MOS transistor having a drain coupled to said bulk, a gate coupled to a logic complement signal of said first signal, and a source coupled to a voltage supply.

5. The circuit of claim 1 wherein said select MOS transistor comprises a PMOS transistor.

6. The circuit of claim 4 said first MOS transistor and said second MOS transistors comprise PMOS transistors.

7. The circuit of claim 4 wherein said select MOS transistor, first MOS transistor, and second MOS transistor comprise NMOS transistors.

8. An imaging system comprising:
   a controller circuit;
   an imaging array, coupled to said controller; and
   a circuit coupled to said controller circuit and to said imaging array, said circuit including
      at least two driver circuits to receive analog information, from said imaging array, each driver circuit including
      a select transistor to pass a value related to said analog information to said analog bus when said driver circuit is selected, said select transistor having a source and a bulk, and
      bulk potential control circuit (BPCC) to couple said bulk to said source when said driver circuit is selected and to couple said bulk to a voltage supply when said driver circuit is not selected.

9. The circuit of claim 8, said driver circuit includes a source follower circuit (SFC) to receive said analog information and drive said analog information to said select transistor.

10. The circuit of claim 8, said BPCC includes first MOS transistor device having a drain coupled to said bulk, a source coupled to said source of said select transistor and a gate coupled to a gate of said select transistor.

11. The circuit of claim 10, said first MOS transistor having a gate coupled to a SELECT signal, said BPCC includes a second MOS transistor having a drain coupled to said bulk, a gate coupled to a complement signal $\overline{\text{SELECT}}$ of said SELECT signal, and a source coupled to a voltage supply.

12. The circuit of claim 8 wherein said select MOS transistor is a PMOS transistor.

13. The circuit of claim 11 said first MOS transistor and said second MOS transistors are PMOS transistors.

14. The circuit of claim 11 wherein said select MOS transistor, first MOS transistor, and second MOS transistor are NMOS transistors.

15. A circuit comprising:
   an analog bus; and
   at least two driver circuits, coupled to said analog bus, including, each driver circuit including
      a select transistor having a gate to receive a first signal, a source coupled to said analog bus, and a bulk;
      a first transistor having a drain coupled to said bulk, a source coupled to said source of said select transistor and a gate to receive said first signal, and
      a second transistor having a drain coupled to said bulk a gate coupled to receive a complement signal of said first signal and a source coupled to a supply voltage.

16. The circuit of claim 15, said driver circuit includes a source follower circuit (SFC) to receive said analog information and drive said analog information to said select transistor.

17. The circuit of claim 15, said first and second transistors include Metal Oxide Semiconductor field effect transistors.

18. A system comprising:

an analog bus; and at least one input circuit, coupled to said analog bus, to receive analog input information and to drive a value related to said analog input to said analog bus, said at least one input circuit including a select transistor to pass said value to said analog bus when said input circuit is selected, said select transistor having a source and a bulk, and a bulk potential control circuit (BPCC) to substantially equalize voltages at said bulk and said source when said input circuit is selected and to turn off said select transistor when said input circuit is not selected.

19. The circuit of claim 18, said driver circuit includes a source follower circuit (SFC) to receive said analog information and drive said analog information to said select transistor.

20. The circuit of claim 18, said BPCC includes first MOS transistor device having a drain coupled to said bulk, a source coupled to said source of said select transistor and a gate coupled to a gate of said select transistor.

21. A system comprising:

an analog bus;

at least two driver circuits, coupled to said analog bus, to receive analog information and to drive a value related to said analog information to said analog bus; each driver circuit comprising a select Metal Oxide Semiconductor (MOS) transistor to pass said value to said analog bus when said driver circuit is selected, said select transistor having a source and a bulk; and a bulk potential control circuit (BPCC) to couple said bulk to said source when said driver circuit is selected and to couple said bulk to a voltage supply when said driver circuit is not selected.

22. The circuit of claim 21, said driver circuit includes a source follower circuit (SFC) to receive said analog information and drive said analog information to said select transistor.

23. The circuit of claim 21, said BPCC includes first MOS transistor device having a drain coupled to said bulk, a source coupled to said source of said select transistor and a gate coupled to a gate of said select transistor.

24. A method to transfer analog information via an analog bus, the method comprising:

passing a value related to said analog information to said analog bus by a select transistor when a driver circuit is selected;

coupling a bulk of said select transistor to a source of said select transistor when the driver circuit is selected; and coupling said bulk to a voltage supply when said driver circuit is not selected.

\* \* \* \* \*

UNITED STATES PATENT AND TRADEMARK OFFICE
CERTIFICATE OF CORRECTION

PATENT NO.     : 5,939,936
DATED          : August 17, 1999
INVENTOR(S)    : Beiley et al.

It is certified that error appears in the above-identified patent and that said Letters Patent is hereby corrected as shown below:

Column 5,
Line 56, delete "transist or" and insert -- transistor --.

Signed and Sealed this

Twenty-fifth Day of March, 2003

JAMES E. ROGAN
*Director of the United States Patent and Trademark Office*